United States Patent

Brady et al.

[11] Patent Number: 6,034,405
[45] Date of Patent: Mar. 7, 2000

[54] BONDING OF ALUMINUM OXIDE COMPONENTS TO SILICONS SUBSTRATES

[75] Inventors: Michael Francis Brady, Morrisville; Mindaugas Fernand Dautartas, Alburtis; James F. Dormer, Limekiln, all of Pa.; Sailesh Mansinh Merchant, Orlando, Fla.; Casimir Roman Nijander, Lawrenceville, N.J.; John William Osenbach, Kutztown, Pa.

[73] Assignee: Lucent Technologies, Inc., Murray Hill, N.J.

[21] Appl. No.: 08/899,291

[22] Filed: Jul. 22, 1997

[51] Int. Cl.[7] .................. H01L 31/0232; H01L 31/00; G02B 6/32
[52] U.S. Cl. ..................... 257/432; 257/466; 385/35
[58] Field of Search .................. 385/33, 14, 34, 385/35; 257/466, 432, 761, 762, 764, 765

[56] References Cited

U.S. PATENT DOCUMENTS

| | | | |
|---|---|---|---|
| 3,983,284 | 9/1976 | Croset | 428/195 |
| 5,178,319 | 1/1993 | Coucoulas | 228/234 |
| 5,194,105 | 3/1993 | Nguyen | 156/293 |
| 5,559,918 | 9/1996 | Furuyama et al. | 385/92 |
| 5,567,981 | 10/1996 | Bhansali et al. | 257/643 |
| 5,784,509 | 7/1998 | Yamane et al. | 385/49 |

OTHER PUBLICATIONS

U.S. Patent Application Serial Number 60/009116 filed on Dec. 22, 1995 (Anigbo).

*Primary Examiner*—Brian Dutton
*Attorney, Agent, or Firm*—L. H. Birnbaum

[57] ABSTRACT

The invention is a method and resulting device which provides a strong bond between a silicon substrate and an oxide component mounted within a cavity in the substrate. A layer of titanium, for example, is deposited on the walls of the cavity, followed by deposition of a layer of aluminum. The structure is preferably annealed to form titanium silicide and titanium-aluminum interface layers. The component is then bonded to the aluminum layer.

5 Claims, 2 Drawing Sheets ional Application of Anigbo, Ser. No. 60/009116, filed Dec. 22, 1995.)

BONDING OF ALUMINUM OXIDE COMPONENTS TO SILICONS SUBSTRATES

FIELD OF THE INVENTION

This invention relates to the bonding of oxide components to substrates, and in particular, to bonding of optical components to silicon substrates in optical subassemblies.

BACKGROUND OF THE INVENTION

In the optoelectronics art, it has become increasingly popular to mount a plurality of optical components on a silicon substrate, a technology also known as silicon optical bench (SiOB) technology. (See, e.g., U.S. Provisional Application of Anigbo, Ser. No. 60/009116, filed Dec. 22, 1995.) Such assemblies typically include a semiconductor laser mounted on the surface of the silicon substrate in alignment with a lightguiding element such as a spherical lens which is mounted within a cavity formed in the silicon substrate. The lens is typically made of a high index material such as spinel or garnet, and is bonded to the cavity walls by means of an aluminum layer deposited on the substrate. (See U.S. Pat. No. 5,178,319 issued to Coucoulas which is incorporated by reference herein.)

While standard practice in planar silicon technology usually provides adequate aluminum adhesion, we have found that for some SiOB applications the aluminum layer can delaminate from the cavity surfaces during sawing of the substrate and/or during bonding of the lens because of inadequate adhesion. This problem is due at least in part to the difficulty in cleaning the cavity prior to bonding.

Therefore it is desirable to provide enhanced adhesion of the aluminum layer and more reliable bonding of the components to the substrate.

SUMMARY OF THE INVENTION

The invention in accordance with one aspect is an optoelectronics device including a silicon substrate including a cavity formed in a major surface. A layer comprising a metal such as titanium is formed over a portion of the substrate including the cavity. A layer comprising aluminum is formed over the titanium layer. An oxide component is bonded to the aluminum layer.

In accordance with another aspect, the invention is a method of bonding a component to an aluminum metalization layer on a silicon substrate including a cavity formed in a major surface. A layer comprising a metal such as titanium is deposited on a portion of the surface of the silicon substrate including the cavity. A layer comprising aluminum is then deposited over the titanium layer. An oxide component is then bonded to the aluminum layer.

BRIEF DESCRIPTION OF THE DRAWINGS

These and other features are delineated in detail in the following description. In the drawing.

It will be appreciated that, for purposes of illustration, these figures are not necessarily drawn to scale.

DETAILED DESCRIPTION

Figure 1:
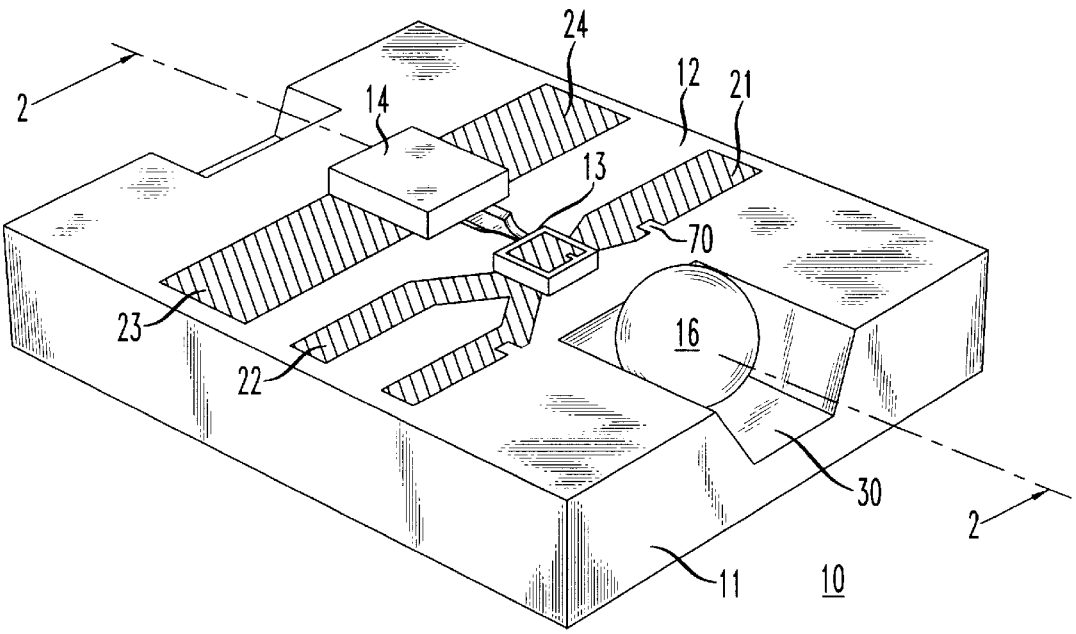
FIG. 1 is a perspective view of a conventional optical subassembly which may be fabricated in accordance with the invention.

Referring now to the drawings, in which like reference numerals identify similar or identical elements, FIG. 1 illustrates a typical optical subassembly. In this example, the subassembly, 10, is an optical subassembly which is described in more detail in the Application of Anigbo et al, cited previously. The subassembly comprises a semiconductor substrate, 11, which is typically silicon. The surface, 12, of the substrate lies in the <100> plane in this example. A laser, 13, and a photodiode, 14, are mounted on the surface, 12, with the photodiode aligned to receive light from the backface of the laser. A spherical lens, 16, is also mounted in a cavity, 30, in the substrate, 11, and self-aligned via mechanical registration in the cavity 30 with the laser to focus light received therefrom. The lens, 16, is typically made of a high index aluminum oxide material, such as garnet or spinel. Alternatively, the lens could be made of garnet or spinel with a layer of silicon dioxide or other oxide material on its surface (e.g., tantalum oxide, aluminum oxide, titanium dioxide). Therefore, in the context of this application, an oxide component is considered to be any component which is made of an oxide (e.g., $Al_2O_3$) or has an oxide formed on the surface to be bonded to the substrate. Metallization, 21–24, which is typically Ti/Pt/Au, is also included on the substrate surface to provide electrical contact to the laser and photodiode.

Of particular concern in this application is how the lens, 16, is bonded to the walls of the cavity, 30, so as to achieve a highly reliable structure. In systems using an aluminum bonding such as described in the Coucoulas patent we have found it extremely difficult, if not impossible, to remove from the micromachined cavities all contaminants that may deteriorate the integrity of the bonding process. As a consequence, delamination of Al from the substrate can occur. In this case, the cause of delamination, at least in part, was due to the presence of carbon impurities on the silicon surface. A possible source of the carbon contamination may be carbon containing materials left over from the use of photoresists used to define the Al metallization (36 of FIG. 2) in the micromachined cavity (30 of FIG. 1).

Figure 2:
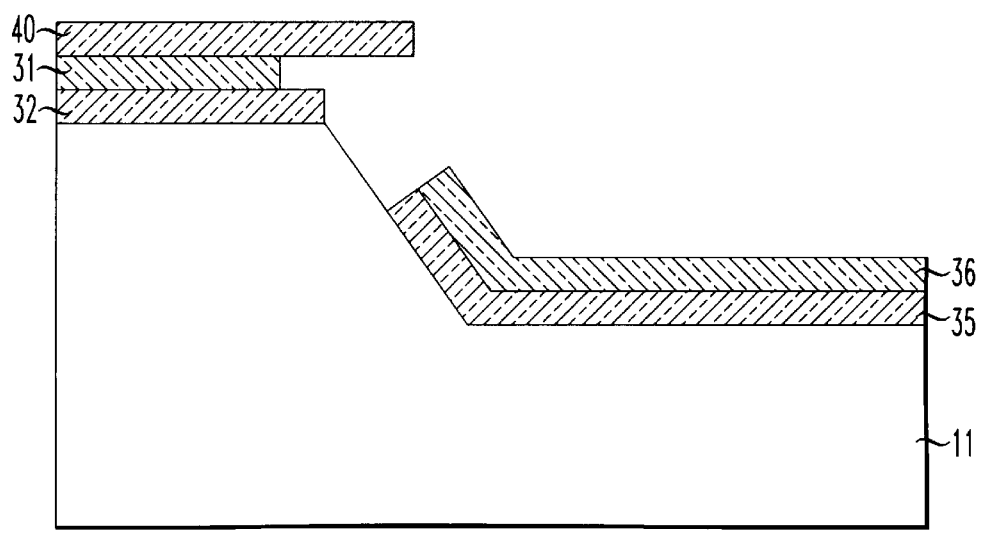
FIGS. 2–4 are cross sectional views along a position of line 2—2 of a subassembly during various stages of fabrication in accordance with an embodiment of the invention.

FIG. 2 illustrates a portion of the substrate, 11, at a stage prior to the bonding of the lens in accordance with an embodiment of the invention. A layer of photoresist, 40, was deposited over the substrate, including the previously formed laser bond pad, 31, and oxide layer, 32, and patterned according to well-known photolithographic techniques to expose the cavity, 30. The photoresist can be a laminate, for example, that sold under the trademark Riston. Alternatively, shadow masks, spin-on or spray-on photoresist may be used.

The cavity walls are typically cleaned by an $O_2$ plasma in accordance with known techniques, for example, at an applied power of 400 Watts and pressure of 1.0 Torr for a period of approximately 10 minutes after the photoresist is applied, patterned, and developed. A thin layer, 35, of titanium was then deposited on the walls of the cavity, for example, by electron beam evaporation. The thickness of the titanium layer is typically 200–300 angstroms, but thicknesses within the range 100 to 2000 angstroms may be utilized. A further layer, 36, comprising aluminum was then deposited over the titanium layer, preferably in situ in the e-beam evaporation chamber. The thickness of the aluminum layer was in the range 5 to 8 microns, but thicknesses in the range 2 to 10 microns would be appropriate.

Figure 3:
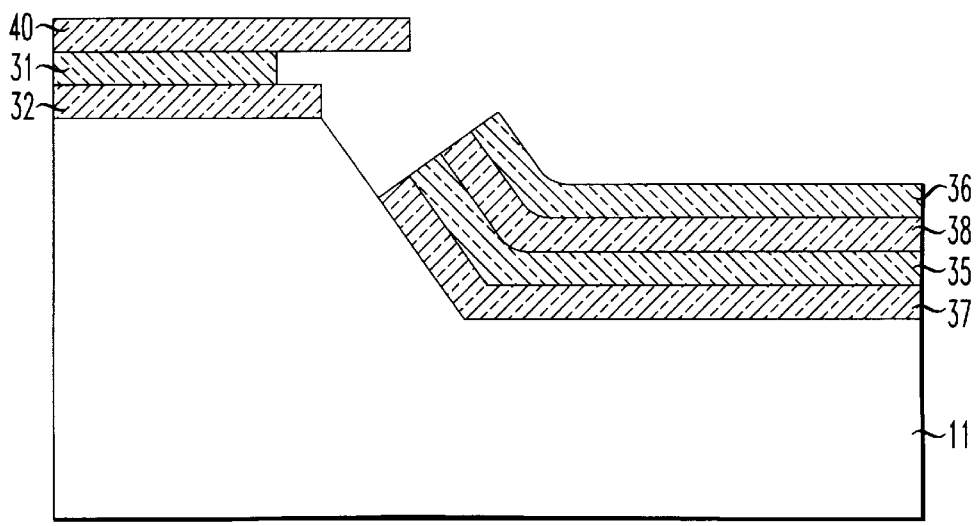

Advantageously, the structure can be annealed for a time and at a temperature sufficient to react at least a portion of the titanium layer, 35, with the underlying silicon substrate and with the overlying aluminum layer, 36. As illustrated in FIG. 3, we believe this step results in the simultaneous formation of a titanium silicide layer, 37, between the titanium layer, 35, and the substrate, 11, and a layer comprising titanium and aluminum, 38, between the titanium layer and the aluminum layer, 36. A typical annealing operation would involve a ramp up from room temperature to approximately 350 degrees C. at a rate of approximately 2.1 degrees C. per minute, followed by heating at 350 degrees C. for approximately 1 hour and then a ramp down to 75 degrees C. at a rate of approx 5 degrees C./minute, and then cooling to room temperature. It was found that the annealing step helps to promote the bonding between the aluminum and the substrate. In general, annealing at a peak temperature in the range 200 to 400 degrees C. for a time within the range 15 minutes to 4 hours and ramp rates within the range 0.5 degrees C./minute to 5 degrees C./minute should be useful. It will be appreciated that the annealing step may not be necessary to achieve adequate bond strength.

Figure 4:
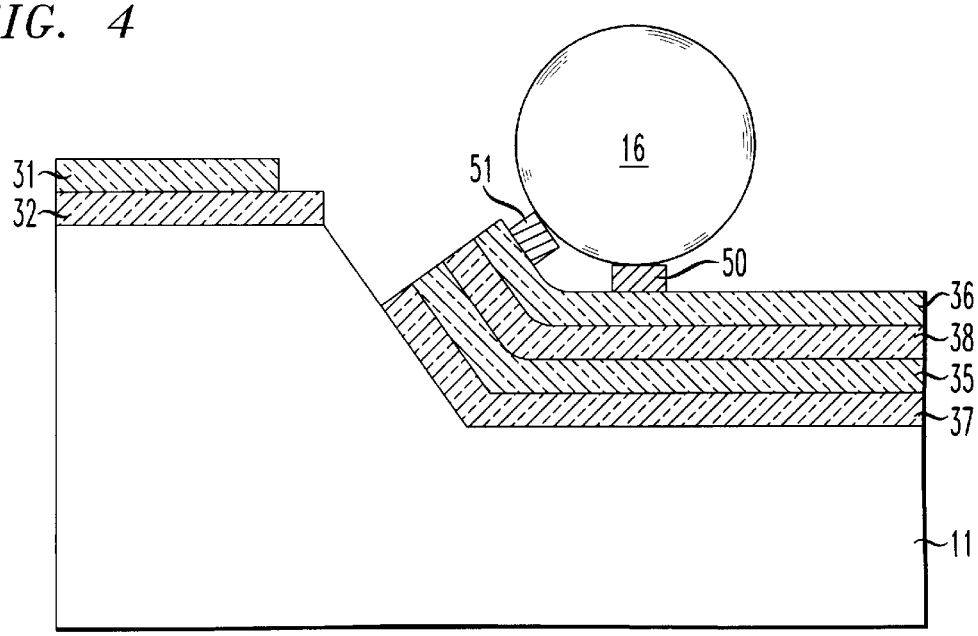

As illustrated in FIG. 4, the lens, 16, was then bonded to the aluminum layer, 36. In particular, the lens was thermocompression bonded by heating the structure at a temperature of 350 degrees C. with a force applied to the lens of 1000 grams. Temperatures in the range 250 to 450 degrees C. and forces in the range 200 grams to 4000 grams should be useful. This step resulted in the formation of bonding regions, 50 and 51, comprising a complex mixture of $Al_2O_3$—Al compounds where the lens contacted the aluminum layer, 36. In addition, strong, continuous, metallurgical bonds were formed along the entire interface (37) between the titanium layer, 35, and silicon substrate, 11, and the interface (38) between the titanium layer (35) and aluminum layer, 36. Thus, no delamination of the aluminum layer, 36, from the substrate, 11, occurs.

It is theorized that the use of the titanium layer eliminates the problem of carbon residue on the surface of the substrate because titanium easily reacts with carbon forming a continuous bonding layer. Titanium may also react with other types of impurities.

Various modifications of the invention will become apparent to those skilled in the art. For example, although pure titanium and aluminum layers are preferred, alloys including these elements can be employed. Further, while the use of titanium is preferred to improve adhesion, other metals such as Zirconium, Hafnium, Vanadium, Niobium, Tantalum, Chromium, Molybdenum and Tungsten, or their alloys, may be useful.

The invention claimed is:

1. An optoelectronics device comprising:
   a silicon substrate having a cavity formed in a major surface;
   a first layer comprising a material selected from the group consisting of Titanium, Zirconium, Hafnium, Vanadium, Niobium, Tantalum, Chromium, Molybdenum and Tungsten formed over a portion of the substrate including the cavity;
   a second layer comprising aluminum formed over the first layer; and
   an oxide component bonded to the second layer.

2. The device according to claim 1 wherein the component comprises a lens.

3. The device according to claim 1 further comprising a third layer comprising titanium and aluminum formed between the first and second layers.

4. The device according to claim 1 wherein the thickness of the first layer is within the range 100 to 200 angstroms, and the thickness of the second layer is within the range 2 to 10 microns.

5. The device according to claim 1 wherein the first layer consists essentially of titanium and the second layer consists essentially of aluminum.

* * * * *